United States Patent
Sugioka et al.

(12) 
(10) Patent No.: US 6,348,540 B1
(45) Date of Patent: Feb. 19, 2002

(54) STYRENIC RESIN COMPOSITION AND SEMICONDUCTOR CARRIER DEVICE

(75) Inventors: Taizou Sugioka; Shinichi Miura; Masami Mihara; Shinobu Yamao, all of Ichihara; Masahiro Nakamichi, Tokyo, all of (JP)

(73) Assignee: Idemitsu Petrochemical Co., Ltd., Tokyo (JP)

( * ) Notice: Subject to any disclaimer, the term of this patent is extended or adjusted under 35 U.S.C. 154(b) by 0 days.

(21) Appl. No.: 09/291,049

(22) Filed: Apr. 14, 1999

(30) Foreign Application Priority Data

Apr. 22, 1998 (JP) ............................................. 10-111248

(51) Int. Cl.[7] .............................................. C08L 25/00

(52) U.S. Cl. ........................ 524/577; 524/449; 524/494; 524/493

(58) Field of Search ................................ 524/577, 493, 524/494, 449

(56) References Cited

U.S. PATENT DOCUMENTS 5,990,217 A * 11/1999 Nakano et al. ............. 524/443
6,087,435 A * 7/2000 Nakano et al. ............. 524/505

* cited by examiner

*Primary Examiner*—Peter D. Mulcahy
(74) *Attorney, Agent, or Firm*—Oblon, Spivak, McClelland, Maier & Neustadt, P.C.

(57) ABSTRACT

Provided is a syndiotactic polystyrenic resin composition, of which the resin moiety comprises any of (A) a syndiotactic styrenic polymer (B) a rubber-like elastomer having affinity for the component (A), (E) a polymer having compatibility with or affinity for the component (A) and having a polar group, (F) a thermoplastic resin except (A), and (G) a polyolefin having MI of at most 25, and which contains from 10 to 350 parts by weight, relative to 100 parts by weight of the resin moiety, of (C) a fibrous filler, and from 10 to 350 parts by weight, relative to the same, of (D) a tabular filler having a mean grain size of from 4 to 700 $\mu$m and a mean aspect ratio of from 12 to 120. Moldings of the composition have good impact resistance and warp little, still having good heat resistance and other good properties intrinsic to styrenic resins.

20 Claims, No Drawings

STYRENIC RESIN COMPOSITION AND SEMICONDUCTOR CARRIER DEVICE

BACKGROUND OF THE INVENTION

1. Field of the Invention

The present invention relates to a styrenic resin composition and a semiconductor carrier device. More precisely, it relates to a styrenic resin composition comprising, as the essential component, a styrenic polymer which consists chiefly of a syndiotactic structure (hereinafter referred to as "syndiotactic polystyrene" or SPS) and containing a fibrous filler and a tabular filler of which the physical morphology is specifically defined, and also to semiconductor carrier devices as produced by molding the styrenic resin composition.

2. Description of the Related Art

Syndiotactic polystyrenes (SPS) have the advantages of good heat resistance, good electrical characteristics, good chemical resistance, etc., and are widely used as engineering plastics for precision components. In order to further expand their applications, it is desired to much more improve the impact resistance of SPS and to prevent the moldings of SPS from being warped.

Regarding the technique of improving the impact resistance of SPS, a styrenic resin composition has been proposed, which comprises SPS and contains a surface-modified inorganic filler and other additives (JP-A 03-126743).

The improvement in the impact resistance of the composition could be rather well, but the reduction in the warpage of the moldings of the composition is not satisfactory for severer requirements. Given that situation, it is desired to develop materials that satisfy both high impact resistance and low warpage.

The present invention has been made from the viewpoint noted above, and its object is to provide a syndiotactic polystyrenic resin composition of which the moldings have good impact resistance and warp little, still having good heat resistance and other good properties intrinsic to styrenic resins, and to provide semiconductor carrier devices as produced by molding the styrenic resin composition.

SUMMARY OF THE INVENTION

We, the present inventors have assiduously studied, and, as a result, have found that the object can be attained by adding a predetermined amount of a fibrous filler and a predetermined amount of a tabular filler of which the physical morphology is specifically defined, to a styrenic resin composition that comprises, as the essential component, a syndiotactic polystyrene (SPS). The invention is completed on the basis of this finding.

Specifically, the invention provides a styrenic resin composition to be mentioned below, and semiconductor carrier devices as produced byt molding the stryrenic resin composition.

1. A stryrenic resin composition comprising,
   a) 100 parts by weight of a styrenic resin composition containing a styrenic polymer that consists chiefly of a syndiotactic structure;
   b) from 10 to 350 parts by weight, relative to 100 parts by weight of the composition, of (C) a fibrous filler and;
   c) from 10 to 350 parts by weight, relative to the same, of (D) a tabular filler having a mean grain size of from 4 to 700 μm and a mean aspect ratio of from 12 to 120.

2. A styrenic resin composition comprising,
   a) 100 parts by weight of a styrenic resin composition containing from 50 to 99% by weight of (A) a styrenic polymer that consists chiefly of a syndiotactic structure and from 1 to 50% by weight of (B) a rubber-like elastomer having affinity for the component (A);
   b) from 10 to 350 parts by weight, relative to 100 parts by weight of the composition, of (C) a fibrous filler and;
   c) from 10 to 350 parts by weight, relative to the same, of (D) a tabular filler having a mean grain size of from 4 to 700 μm and a mean aspect ratio of from 12 to 120.

3. A styrenic resin composition comprising,
   a) 100 parts by weight of a styrenic resin composition containing from 50 to 95% by weight of (A) a styrenic polymer that consists chiefly of a syndiotactic structure, from 1 to 49.9% by weight of (B) a rubber-like elastomer having affinity for the component (A), and from 0.1 to 10% by weight of (E) a polymer having compatibility with or affinity for the component (A) and having a polar group;
   b) from 10 to 350 parts by weight, relative to 100 parts by weight of the composition, of (C) a fibrous filler; and
   c) from 10 to 350 parts by weight, relative to the same, of (D) a tabular filler having a mean grain size of from 4 to 700 μm and a mean aspect ratio of from 12 to 120.

4. A styrenic resin composition comprising,
   a) 100 parts by weight of a styrenic resin composition containing from 5 to 94% by weight of (A) a styrenic polymer that consists chiefly of a syndiotactic structure, from 1 to 50% by weight of (B) a rubber-like elastomer having affinity for the component (A), and from 5 to 94% by weight of (F) a thermoplastic resin except (A);
   b) from 10 to 350 parts by weight, relative to 100 parts by weight of the composition, of (C) a fibrous filler; and
   c) from 10 to 350 parts by weight, relative to the same, of (D) a tabular filler having a mean grain size of from 4 to 700 μm and a mean aspect ratio of from 12 to 120.

5. A styrenic resin composition comprising,
   a) 100 parts by weight of a styrenic resin composition containing from 5 to 93.9% by weight of (A) a styrenic polymer that consists chiefly of a syndiotactic structure, from 1 to 50% by weight of (B) a rubber-like elastomer having affinity for the component (A), from 0.1 to 10% by weight of (E) a polymer having compatibility with or affinity for the component (A) and having a polar group, and from 5 to 93.9% by weight of (F) a thermoplastic resin except (A);
   b) from 10 to 350 parts by weight, relative to 100 parts by weight of the composition, of (C) a fibrous filler; and
   c) from 10 to 350 parts by weight, relative to the same, of (D) a tabular filler having a mean grain size of from 4 to 700 μm and a mean aspect ratio of from 12 to 120.

6. A styrenic resin composition comprising,
   a) 100 parts by weight of a styrenic resin composition containing from 50 to 99% by weight of (A) a styrenic polymer that consists chiefly of a syndiotactic structure and from 1 to 50% by weight of (G) a polyolefin having a melt index (MI), as measured at 190° C. and under a load of 2.16 kg, of at most 25 (g/10 min);
   b) from 10 to 350 parts by weight, relative to 100 parts by weight of the composition, of (C) a fibrous filler; and
   c) from 10 to 350 parts by weight, relative to the same, of (D) a tabular filler having a mean grain size of from 4 to 700 μm and a mean aspect ratio of from 12 to 120.

7. The styrenic resin composition of any one of (1) to (6), wherein the fibrous filler (C) is glass fibers, and the tabular filler (D) having a mean grain size of from 4 to 700 μm and a mean aspect ratio of from 12 to 120 is any of mica or glass flakes.

8. Semiconductor carrier devices as produced by molding the styrenic resin composition of any one of (1) to (7) and having a surface resistance of from $10^2$ to $10^{12}\Omega$.

DETAILED DESCRIPTION OF THE INVENTION

Embodiments of the invention are described in detail hereinunder.

1. Components Constituting the Styrenic Resin Composition of the Invention

The styrenic resin composition of the invention comprises a resin moiety and an inorganic filler moiety to be mentioned below. The resin moiety comprises, as the indispensable component, the component (A) to be mentioned below, and optionally contains the component (B), the component (E), the component (F) and the component (G) also to be mentioned below. The inorganic filler moiety comprises the component (C) and the component (D) to be mentioned below.

I. Resin Moiety (A) Styrenic Polymer Consisting Chiefly of a Syndiotactic Structure In the component (A), styrenic polymer that consists chiefly of a syndiotactic structure, the syndiotactic structure indicates the stereochemical structure of the polymer in which the side chains of phenyl groups are alternately positioned in the opposite sides relative to the main chain composed of carbon-carbon bonds, and its tacticity is determined according to the nuclear magnetic resonance of the polymer with an isotopic carbon ($^{13}$C-NMR). The tacticity to be determined according to $^{13}$C-NMR indicates the proportion of a plurality of continuous constitutional units in a polymer. For example, a polymer comprising two continuous constitutional units is referred to as a diad; that comprising three continuous constitutional units is referred to as a triad; and that comprising five continuous constitutional units is referred to as a pentad. The styrenic polymer that consists chiefly of a syndiotactic structure, as referred to herein, generally has a racemic diad syndiotacticity of at least 75%, preferably at least 85%, or has a racemic pentad syndiotacticity of at least 30%, preferably at least 50%, including, for example, polystyrene, poly(alkylstyrenes), poly(halogenostyrenes), poly(halogenoalkylstyrenes), poly(alkoxystyrenens), poly(vinyl benzoates), hydrogenated derivatives of those polymers, their mixtures, and copolymers consisting chiefly of those polymers. The poly(alkylstyrenes) include, for example, poly(methylstyrene), poly(ethylstyrene), poly(isopropylstyrene), poly(tert-butylstyrene), poly(phenylstyrene), poly(vinylnaphthalene), poly(vinylstyrene), etc. The poly(halogenostyrenes) include, for example, poly(chlorostyrene), poly(bromostyrene), poly(fluorostyrene), etc. The poly(halogenoalkylstyrenes) include, for example, poly(chloromethylstyrene), etc. The poly(alkoxystyrenes) include, for example, poly(methoxystyrene), poly(ethoxystyrene), etc.

Of those styrenic polymers, especially preferred are polystyrene, poly(p-methylstyrene), poly(m-methylstyrene), poly(p-tert-butylstyrene), poly(p-chlorostyrene), poly(m-chlorostyrene), poly(p-fluorostyrene), hydrogenated polystyrenes, and copolymers comprising those constitutional units.

Styrenic polymers of that type, consisting chiefly of a syndiotactic structure, can be prepared in any known methods. For example, one method of producing them comprises polymerizing styrenic monomers (corresponding to the intended styrenic polymers) in an inert hydrocarbon solvent or in the absence of a solvent, using a catalyst that comprises a titanium compound and a condensation product of a trialkylaluminium compound with water (JP-A 62-187708, etc.). Poly(halogenoalkylstyrenes) and their hydrogenated derivatives can also be produced in any known methods. For example, they may be produced according to the methods described in JP-A 1-46912, JP-A 1-178505, etc.

The molecular weight of the styrenic polymer for use in the invention is not specifically defined, but its weight-average molecular weight is preferably not smaller than 10,000, more preferably not smaller than 50,000. The molecular weight distribution of the polymer is not also specifically defined, and the polymer may have any undefined molecular weight distribution. However, styrenic polymers having a weight-average molecular weight of smaller than 10,000 are unfavorable, since the thermal properties and the mechanical properties of the composition comprising the polymer and those of the moldings of the composition are poor.

One or more of styrenic polymers with a syndiotactic structure such as those mentioned above are usable in the invention either singly or as combined.

(B) Rubber-like Elastomer Having Affinity for SPS of the Component (A)

Specific examples of the rubber-like elastomer (B) for use in the invention include natural rubber, polybutadiene, polyisoprene, polyisobutylene, neoprene, polysulfide rubber, Thiokol rubber, acrylic rubber, urethane rubber, silicone rubber, epichlorohydrin rubber, styrene-butadiene block copolymer (SBR), hydrogenated styrene-butadiene block copolymer (SEB, SEBC), styrene-butadiene-styrene block copolymer (SBS), hydrogenatedstyrene-butadiene-styrene block copolymer (SEBS), styrene-isoprene block copolymer (SIR), hydrogenated styrene-isoprene block copolymer (SEP), styrene-isoprene-styrene block copolymer (SIS), hydrogenated styrene-isoprene-styrene block copolymer (SEPS), ethylene-propylene rubber (EPR), ethylene-propylene-diene rubber (EPDM); core/shell type, granular elastomers, such as butadiene-acrylonitrile-styrene core/shell rubber (ABS), methyl methacrylate-butadiene-styrene core/shell rubber (MBS), methyl methacrylate-butyl acrylate-styrene core/shell rubber (MAS), octyl acrylate-butadiene-styrene core/shell rubber (MABS), alkyl acrylate-butadiene-acrylonitrile-styrene core/shell rubber (AABS), butadiene-styrene core/shell rubberb (SBR), siloxane-containing core/shell rubber of typically methyl methacrylate-butyl acrylate siloxanes, etc.; and denatured rubbers to be prepared by denaturing those rubber materials. Of those, especially preferred are SBR, SEB, SBS, SEBS, SIR, SEP, SIS, SEPS, core/shell rubbers, EPM, EPDM, and denatured rubbers from them.

One or more of those rubber-like elastomers may be used herein either singly or as combined.

(E) Polymer Having Compatibility with or Affinity for the Component (A) and having a Polar Group It is desirable to add a polymer having compatibility with or affinity for the component (A) and having a polar group, as the component (E), to the resin composition of the invention, for the purpose of improving the adhesiveness of the resin to the inorganic fillers in the composition. The inorganic fillers will be mentioned in detail hereinunder.

The polymer having compatibility with or affinity for the component (A) shall have a chain moiety having compatibility with or affinity for the component (A) in the polymer chain. The polymer of that type having compatibility with or affinity for the component (A) includes, for example, those having any moiety of syndiotactic polystyrene, atactic polystyrene, isotactic polystyrene, styrenic copolymer, polyphenylene ether, polyvinyl methyl ether and the like, in the main chain, or blocked or grafted chains.

The polar group as referred to herein may be any and every one capable of improving the resin adhesiveness to inorganic fillers, and includes, for example, residues of acid anhydrides, carboxylic acids, carboxylates, carboxylic acid chlorides, carboxylic acid amides, salts of carboxylic acids, sulfonic acids, sulfonates, sulfonic acid chlorides, sulfonic acid amides, salts of sulfonic acids, as well as epoxy groups, amino groups, imido groups, oxazoline groups, etc.

The component (E) can be prepared by reacting a polymer having compatibility with or affinity for the component (A) with a modifier, which will be mentioned below, in the presence or absence of a solvent and any other resin. As the modifier, for example, usable herein are compounds having both an ethylenic double bond and a polar group in the molecule. Specific examples of the modifier include maleic acid and its derivatives such as maleic anhydride, maleic acid, maleates, maleimides and their N-substituted derivatives, salts of maleic acid; fumaric acid and its derivatives such as fumaric acid, fumarates, salts of fumaric acid; itaconic acid and its derivatives such as itaconic anhydride, itaconic acid, itaconates, salts of itaconic acid; acrylic acid and its derivatives such as acrylic acid, acrylates, acrylic acid amides, salts of acrylic acid; methacrylic acid and its derivatives such as methacrylic acid, methacrylates, methacrylic acid amides, salts of methacrylic acid, glycidyl methacrylate; etc. Of those, especially preferred are maleic anhydride, fumaric acid, and glycidyl methacrylate.

For the modification, any known methods are employable. For example, employable are a method of melting and kneading the reactants in a roll mill, a Banbury mixer, an extruder or the like at a temperature falling between 150° C. and 350° C. and reacting them therein; and a method of heating the reactants in a solvent of, for example, benzene, toluene, xylene or the like, and reacting them therein. In order to facilitate the reaction, it is effective to add a radical-generating agent, such as benzoyl peroxide, di-t-butyl peroxide, dicumyl peroxide, t-butyl peroxybenzoate, azobisisobutyronitrile, azobisisovaleronitrile, 2,3-diphenyl-2,3-dimethylbutane or the like to the reaction system. As the radical-generating agent, especially preferred is 2,3-diphenyl-2,3-dimethylbutane.

One preferred method for the modification comprises melting and kneading the reactants in the presence of the radical-generating agent. Any other resins maybe added to the system for modification.

Specific examples of the component (E) include modified styrenic polymers such as styrene-maleic anhydride copolymer (SMA), styrene-glycidyl methacrylate copolymer, carboxyl-terminated polystyrene, epoxy-terminated polystyrene, oxazoline-terminated polystyrene, amine-terminated polystyrene, sulfonated polystyrene, styrenic ionomer, styrene-methyl methacrylate graft copolymer, (styrene-glycidyl methacrylate)-methyl methacrylate graft copolymer, acid-modified acrylic-styrene graft copolymer, (styrene-glycidyl methacrylate)-styrene graft copolymer, polybutylene terephthalate-polystyrene graft copolymer, maleic anhydride-modified PS, fumaric acid-modified PS, glycidyl methacrylate-modified PS, amine-modified PS, etc.; modified polyphenylene etheric polymers such as (styrene-maleic anhydride)-polyphenylene ether graft copolymer, maleic anhydride-modified polyphenylene ether, glycidyl methacrylate-modified polyphenylene ether, amine-modified polyphenylene ether, etc.

Of those, preferred are modified PS, and modified polyphenylene ether. Two or more of those polymers maybe used, as combined.

The polar group content of the component (E) is preferably from 0.01 to 20% by weight, more preferably from 0.05 to 10% by weight, relative to 100% by weight of the component (E). If the content is smaller than 0.01% by weight, a large amount of the component (E) must be added to the composition so as to improve the resin adhesiveness to the inorganic fillers in the composition. However, adding such a large amount of the component (E) to the composition is unfavorable, as often interfering with the mechanical properties, the heat resistance and the moldability of the composition. On the other hand, if the content is larger than 20% by weight, the component (E) having such a large polar group content is also unfavorable since its compatibility with the components (A) and (B) in the composition is often poor.

(F) Thermoplastic Resin Except the Component (A)

Any known thermoplastic resins are usable herein. Concretely mentioned are polyolefinic resins such as linear, high-density polyethylene, linear, low-density polyethylene, high-pressure, low-density polyethylene, isotactic polypropylene, syndiotactic polypropylene, block polypropylene, random polypropylene, polybutene, 1,2-polybutadiene, cyclic polyolefins, poly-4-methylterpene; polystyrenic resins such as polystyrene, HIPS; polyester resins such as polycarbonate, polyethylene terephthalate, polybutylene terephthalate; polyamide resins such as polyamide 6, polyamide 6,6; polyarylene sulfide resins, etc.

One or more of those thermoplastic resins can be used herein either singly or as combined.

(G) Polyolefin Having a Melt Index (MI), as Measured at 190° C. and Under a Load of 2.16 kg, of at Most 25 (g/10 min)

The polyolefin of the component (G) for use in the invention may be any and every one that comprises monomer units derived from olefins or dienes of, for example, ethylene, propylene, butylene, butene, octene, butadiene, isoprene, norbornene, norbornadiene, cyclopentadiene, etc. Any known polyolefins are usable as the component (G).

Concretely, the polyolefin of the component (G) includes, for example, ethylene-propylene rubber copolymer (EPR), ethylene-propylene-diene rubber (EPDM), ethylene-octene copolymer elastomer, isotactic polypropylene, block polypropylene, random polypropylene, high-density polyethylene, linear, low-densitypolyethylene, high-pressure, low-density polyethylene, polybutene, polybudadiene, polyisoprene, polyisobutylene, cyclic polyolefins, poly-4-methylpentene, etc. Of those, preferred are EPR, EPDM, ethylene-octene copolymer elastomer, polypropylene, and polyethylene.

The polyolefin of the component (G) for use in the invention has a melt index (MI), as measured at 190° C. and under a load of 2.16 kg, of at most 25 (g/10 min), but preferably at most 20, more preferably at most 15. If its MI is higher than 25, the viscosity of the polyolefin will be too low, and the dispersibility of the polyolefin having such a low viscosity in SPS will be poor. The lowermost limit of MI of the polyolefin is not specifically defined, and may be determined within a practicable range.

One or more of those polyolefins can be used herein either singly or as combined.

II. Inorganic Filler Moiety (C) Fibrous Filler

The fibrous filler for use in the invention includes, for example, glass fibers, carbon fibers, whiskers, etc. The whiskers may have any composition of, for example, carbon, potassium titanate, magnesia, silicon carbide, silicon nitride, zinc oxide, calcium carbonate, etc. The fibrous filler may be in any form of fabrics, mats, chopped strands, short fibers, filaments, whiskers, etc. The chopped strands preferably have a length of from 0.05 to 50 mm and a fiber diameter of from 5 to 20 $\mu$m.

As the filler, especially preferred is a glass filler, more preferred are glass fibers.

The filler is preferably surface-treated. Coupling agents may be used for the surface treatment, which are for improving the adhesiveness between the filler and the resin in the composition. The coupling agents may be any conventional ones, including, for example, so-called silane-type coupling agents, titanium-containing coupling agents and the like. Especially preferred are aminosilanes and epoxysilanes, such as γ-aminopropyltrimethoxysilane, N-β-(aminoethyl)-γ-aminopropyltrimethoxysilane, γ-glycidoxypropyltrimethoxysilane, β-(3,4-epoxycyclohexyl)ethyltrimethoxysilane, etc.; and isopropyltri(N-amidoethyl, aminoethyl) titanates.

The coupling agent may be combined with a film former for glass. The film former is not specifically defined. For example, employable are polyester-type, polyether-type, urethane-type, epoxy-type, acrylic, and vinyl acetate-type polymers, etc.

One or more of those fibrous fillers are usable herein either singly or as combined.

(D) Tabular Filler

The tabular filler for use in the invention includes, for example, mica, glass flakes, tabular talc, flaky graphite, etc.

Regarding its physical morphology, the tabular filler must have a mean grain size of from 4 to 700 $\mu$m and a mean aspect ratio of from 12 to 120. More preferably, it has a mean grain size of from 10 to 200 $\mu$m and a mean aspect ratio of from 15 to 100. Of the tabular fillers noted above, especially preferred are mica and tabular talc.

The filler is preferably surface-treated. Coupling agents may be used for the surface treatment, which are for improving the adhesiveness between the filler and the resin in the composition. The coupling agents may be any conventional ones, including, for example, so-called silane-type coupling agents, titanium-containing coupling agents and the like. Especially preferred are aminosilanes and epoxysilanes, such as γ-aminopropyltrimethoxysilane, N-γ-(aminoethyl)-γ-aminopropyltrimethoxysilane, γ-glycidoxypropyltrimethoxysilane, β-(3,4-epoxycyclohexyl)ethyltrimethoxysilane, etc.; and isopropyltri(N-amidoethyl, aminoethyl) titanates.

The coupling agent may be combined with a film former for glass. The film former is not specifically defined. For example, employable are polyester-type, polyether-type, urethane-type, epoxy-type, acrylic, and vinyl acetate-type polymers, etc.

One or more of those tabular fillers are usable herein either singly or as combined.

III. Other Additives

In addition to the components (A) to (G) noted above, the styrenic resin composition of the invention may further contain various additives not interfering with the object of the invention. The additives include, for example, granular or powdery inorganic fillers, nucleating agents, plasticizers, mold release agent, antioxidants, flame retardants, flame retardant promoters, conductive materials, pigments, antistatic agents, etc. One or more those additives may be added to the composition either singly or as combined.

(1) Granular or Powdery Inorganic Filler

The filler includes, for example, carbon black, graphite, titanium dioxide, silica, calcium sulfate, calcium carbonate, barium carbonate, magnesium carbonate, magnesium sulfate, barium sulfate, oxysulfates, tin oxide, alumina, kaolin, silicon carbide, metal powder, glass powder, glass beads, etc.

Of those fillers, for example, especially preferred are glass powder and glass beads, and more preferred are glass beads.

The fillers are also preferably surface-treated. Coupling agents may be used for the surface treatment, which are for improving the adhesiveness between the filler and the resin in the composition. The coupling agents may be any conventional ones, including, for example, so-called silane-type coupling agents, titanium-containing coupling agents and the like. Especially preferred are amino silanes and epoxysilanes, such as γ-aminopropyltrimethoxysilane, N-β-(aminoethyl)-γ-aminopropyltrimethoxysilane, γ-glycidoxypropyltrimethoxysilane, β-(3,4-epoxycyclohexyl)ethyltrimethoxysilane, etc.; and isopropyltri(N-amidoethyl, aminoethyl) titanates.

The coupling agent may be combined with a film former for glass. The film former is not specifically defined. For example, employable are polyester-type, polyether-type, urethane-type, epoxy-type, acrylic, and vinyl acetate-type polymers, etc.

One or more of those inorganic fillers are usable herein either singly or as combined.

(2) Nucleating Agent

The nucleating agent is to promote the crystallization of SPS in the composition and to increase the solvent resistance of the composition. The nucleating agent may be any conventional one, including, for example, metal carboxylates such as aluminium di (p-t-butylbenzoate); metal phosphates such as sodiummethylene-bis (2,4-di-t-butylphenol) acid phosphate; and talc, phthalocyanine derivatives, etc.

(3) Plasticizer

The plasticizer may be any conventional one, including, for example, polyethylene glycol, polyamide oligomer, ethylene-bis-stearamide, phthalates, polystyrene oligomer, polyethylene wax, mineral oil, silicone oil, etc.

(4) Mold Release Agent

The mold release agent may be any conventional one, including, for example, polyethylene wax, silicone oil, long-chain carboxylic acids, salts of long-chain carboxylic acids, etc.

(5) Antioxidant

The antioxidant may be any conventional one, including, for example, phosphorus-based, phenol-based, and sulfur-based antioxidants, etc.

(6) Flame Retardant, Flame Retardant Promoter

The flame retardant maybe any conventional one, including, forexample, brominated polymers such as brominated polystyrene, brominated syndiotactic polystyrene, and brominated polyphenylene ether; and brominated aromatic compounds such as brominated diphenylalkanes and brominated diphenyl ethers. The flame retardant promoter may be any conventional one, including, for example, antimony compounds such as antimony trioxide, and others.

(7) Conductive Material

The conductive material may be any conventional one, including, for example, gases such as natural gas, petroleum gas, furnace gas, etc.; oils such as heavy oil, pitch oil, creosote oil, etc.; naphthalene, anthracene, etc.; carbonblack such as furnace black and lamp black to be formed in incomplete furnace combustion, channel black, roll black and disc black to be formed in incomplete contact combustion, thermal black and ketjen black to be formed through pyrolysis, etc.; carbon fibers to be obtained from pitch, cellulose, polyacrylonitrile, phenolic resin, etc.; as well as graphite powder, graphite whiskers, metal powder, metal fibers, etc. One or more of these conductive materials may be used herein either singly or as combined.

2. Proportions of Components that Constitute the Styrenic Resin Composition

I. Resin Moiety (1) Where the Resin Moiety Comprises Two Components (A) and (B)

In the resin moiety, the proportion of the component (A), SPS, is from 50 to 99% by weight, and that of the component (B), rubber-like elastomer having affinity for the component (A), is from 1 to 50% by weight. If the proportion of the component (B) is smaller than 1% by weight, the stiffness of the composition will be poor. If the proportion of SPS is smaller than 50% by weight, the composition could not exhibit the properties of SPS.

(2) Where the Resin Moiety Comprises Three Components (A), (B) and (E)

The proportion of the component (A), SPS, is from 50 to 95% by weight, that of the component (B), rubber-like elastomer having affinity for the component (A), is from 1 to 49.9% by weight, and that of the component (E), polymer having compatibility with or affinity for the component (A) and having a polar group, is from 0.1 to 10% by weight. If the proportion of the component (E) is smaller than 0.1% by weight, the component (E) could not exhibit its effect as a compatibility improver; but if larger than 10% by weight, the heat resistance of the composition will be low.

(3) Where the Resin Moiety Comprises Three Components (A), (B) and (F)

The proportion of the component (A), SPS, is from 5 to 94% by weight, that of the component (B), rubber-like elastomer having affinity for the component (A), is from 1 to 50% by weight, and that of the component (F), thermoplastic resin except (A), is from 5 to 94% by weight. If the proportion of the component (F) is smaller than 5% by weight, the thermoplastic resin of the component (F) could not exhibit its effect; but if larger than 94% by weight, the heat resistance of the composition will be low.

(4) Where the Resin Moiety Comprises Four Components (A), (B), (E) and (F)

The proportion of the component (A), SPS, is from 5 to 93.9% by weight, that of the component (B), rubber-like elastomer having affinity for the component (A), is from 1 to 50% by weight, that of the component (E) having compatibility with or affinity for the component (A) and having a polar group, is from 0.1 to 10% by weight, and that of the component (F), thermoplastic resin except (A), is from 5 to 93.9% by weight. If the proportion of the component (E) is smaller than 0.1% by weight, the component (E) could not exhibit its effect as a compatibility improver; but if larger than 10% by weight, the heat resistance of the composition will be low. If the proportion of the component (F) is smaller than 5% by weight, the thermoplastic resin of the component (F) could not exhibit its effect; but if larger than 93.9% by weight, the heat resistance of the composition will be low.

(5) Where the Resin Moiety Comprises Two Components (A) and (G)

The proportion of the component (A), SPS, is from 50 to 99% by weight, and that of the component (G), polyolefin having a melt index (MI), as measured at 190° C. and under a load of 2.16 kg, of at most 25 (g/10 min), is from 1 to 50% by weight. If the proportion of the component (G) is smaller than 1% by weight, the stiffness of the composition will be poor. If the proportion of SPS is smaller than 50% by weight, the composition could not exhibit the properties of SPS.

The resin composition of the invention comprises from 10 to 350 parts by weight, relative to 100 parts by weight of the resin moiety having the constitution of any one of (1) to (4) noted above, of (C) a fibrous filler, and from 10 to 350 parts by weight, relative to the same, of (D) a tabular filler having a mean grain size of from 4 to 700 μm and a mean aspect ratio of from 12 to 120. If the amount of the fibrous filler (C) is smaller than 10 parts by weight, the flexural strength of the moldings of the composition will be low; but if larger than 350 parts by weight, the dispersibility of the composition will be poor and the composition will be difficult to mold. If the amount of the tabular filler (D) is smaller than 10 parts by weight, the moldings of the composition will be much warped; but if larger than 350 parts by weight, the dispersibility of the composition will be poor and the composition will be difficult to mold.

The ratio of the fibrous filler (C) to the tabular filler (D) in the composition is not specifically defined, but is preferably falls between 5:1 and 1:10, more preferably between 3:1 and 1:8, even more preferably between 1:1 and 1:5, in terms of (C):(D). If the proportion of the fibrous filler (C) is too small, the strength of the composition will be low; and if the proportion of the tabular filler (D) is too small, the effect of the tabular filler (D) to prevent the moldings of the composition from being warped will be low.

3. Method of Producing the Styrenic Resin Composition of the Invention

The method of producing the styrenic resin composition of the invention is not specifically defined, and the composition may be produced in any known methods. For example, the resin composition of the invention may be produced by melting and kneading the constituent components and the additives mentioned above in any of ribbon blenders, Henschel mixers, Banbury mixers, drum tumblers, single-screw extruders, double-screw extruders, cokneaders, multi-screw extruders, etc.

Preferably, the resin temperature during the melting and kneading step falls between the melting point of SPS used and 270° C., more preferably between the melting point of SPS and 265° C., even more preferably between the melting point of SPS and 260° C. If the resin temperature is lower than the melting point of SPS, SPS could not be well dispersed in the composition formed, thereby often resulting in that the solvent resistance of the composition is lowered and the impact resistance of the moldings of the composition is lowered. On the other hand, however, if the resin temperature is higher than 270° C., SPS will be degraded, thereby often resulting in that the impact resistance of the moldings of the composition is lowered.

4. Method of Molding the Styrenic Resin Composition of the Invention

The method of molding the resin composition of the invention is not also specifically defined. For example, the resin composition may be molded in any known methods of injection molding, extrusion molding, etc.

The resin temperature during the molding step is not specifically defined, and may be not lower than the melting point of the resin composition. Preferably, however, the resin temperature falls between 280 and 320° C.

In the molding step, the mold temperature (actual temperature) may be not lower than 50° C., but preferably falls between 80 and 150° C.

5. Applications of the Styrenic Resin Composition of the Invention

The styrenic resin composition of the invention has many applications with no specific limitation. Since the moldings of the composition warp little, they are favorable to electronic components. For example, they are especially favorable to semiconductor carrier devices, such as IC trays having a surface resistance of from $10^2$ to $10^{12} \Omega$, preferably from $10^4$ to $10^{10} \Omega$.

IC trays made from the composition of the invention may be annealed, whereby their dimension stability could be much more enhanced and little vapor will be generated by them.

While heated repeatedly, the change in the physical properties and the dimension of the styrenic resin composition of the invention is small, and the composition has good thermal stability.

The invention is described in more detail with reference to the following Examples and Comparative Examples, which, however, are not intended to restrict the scope of the invention.

Test Methods for Evaluating Samples

Flexural Strength

This is measured according to JISK7203.

Izod Impact Strength

This is measured according to JISK7110, in which the samples to be tested are notched.

Deflection Temperature Under Load

This is measured according to JISK7207.

Warpage

Disc samples having a thickness of 1 mm and a diameter of 100 mm are produced through injection molding of a resin composition to be tested, for which the mold temperature is 150° C. After left cooled for 10 hours, the degree of warpage of each disc sample is measured. Briefly, in the diameter of each disc sample having warped to a highest degree, a length of 10 mm from the edge is fixed, and a line is extended from the point of 10 mm inside the edge. The distance (unit: mm) between the extended line and the other edge is measured, which indicates the warpage of the sample.

Degree of Warpage

Based on the value of the warpage measured as above, the degree of warpage of each disc sample is obtained. The samples are evaluated as follows:

Rank A: Samples having a value of warpage of smaller than 1 mm.
Rank B: Samples having a value of warpage of from 1 mm to smaller than 5 mm.
Rank C: Samples having a value of warpage of from 5 mm to smaller than 10 mm.
Rank D: Samples having a value of warpage of 10 mm or larger.

Starting Materials Used

Component (A) (SPS)

The weight-average molecular weight (Mw) and the number-average molecular weight (Mn) mentioned below were measured through gel permeation chromatography (GPC) at 150° C., for which was used 1,2,4-trichlorobenzene as the solvent. SPS used herein was produced according to a known method such as that described in JP-A 62-104818, etc.

Weight-average molecular weight, Mw=230,000.
Molecular weight distribution, Mw/Mn=2.50.

Component (B) (Rubber-like Elastomer Having Affinity for Component (A))

SEBS1: SEBS-type elastomer from Shell, trade name of Kraton G1651.

Component (C) (Fibrous Filler)

Glass fibers: trade name of FT712 from Asahi Fiber Glass.
Calcium carbonate whiskers: trade name of Whiskal A from Maruo Calcium.

Component (D) (Tabular Filler)

Mica: trade name of M-200 from Repco, having a mean grain size of 60 μm and a mean aspect ratio of 35.
Glass flakes: trade name of REFG-101, microglass flakes from Nippon Glass Fiber, having a mean grain size of 600 μm and a mean aspect ratio of 100.
Tabular talc: trade name of NK48 from Fuji Talc, having a mean grain size of 11 μm and a mean aspect ratio of 17.

Component (E) (Polymer Having Compatibility With or Affinity For Component (A) and Having a Polar Group)

FAPPO: fumaric acid-modified polyphenylene ether as produced in Production Example 1.

Component (F) (Thermoplastic Resin Except (A))

PPO: poly(2,6-dimethyl-1,4-phenylene ether). This was produced in a known method such as that described in U.S. Pat. No. 3,306,874, etc.

Polyolefin (G)

PE: ethylene-octene copolymer elastomer, trade name of ENGAGE 8150 from DuPont-Daw Elastomer, having MI=0.5.

Other Additives (H)

(1) Inorganic Filler
    Glass beads: trade name of EGB731 from Toshiba Valodini.
    Calcium carbonate: trade name of Vigot-15 from Shiraishi Industry.
(2) Antioxidant
    Ciba-Geigy's Irganox 1010 (trade name).
    Asahi Denka's PEP36 (trade name).
(3) Nucleating Agent
    Asahi Denka's NA11 (trade name).
(4) Conductivity-imparting Agent
    Ketjen black, trade name of EC600JD from Lion.
(5) Mold Release Agent
    Toray-Daw Corning's SH550 (trade name).
(6) Flame Retardant and Flame Retardant Promoter
    Albemal's SAYTEX 8010 (trade name).
    Nihon Seiko's PATOX-M (trade name).
    Kyowa Chemical Industry's DHT4A (trade name).
    Daikin Industry's F201L (trade name).

PRODUCTION EXAMPLE 1

(Production of Fumaric Acid-modified Polyphenylene Ether)

One kg of polyphenylene ether (having an intrinsic viscosity of 0.45 dl/g in chloroform at 25° C.), 30 g of fumaric acid, and 20 g of a radical-generating agent, 2,3-dimethyl-2,3-diphenylbutane (Nofmer BC from NOF) were dry-blended, and then melted and kneaded in a 30-mm double-screw extruder, for which the screw revolution was 200 rpm and the temperature was 300° C. In this step, the resin temperature was about 331° C. The strands were cooled and then pelletized to obtain pellets of a fumaric acid-modified polyphenylene ether. The degree of modification of the modified polyphenylene ether was obtained as follows: One g of the modified polyphenylene ether was dissolved in ethylbenzene, and then re-precipitated in methanol. The polymer was recovered, and extracted with methanol, using a Soxhlet extractor. This was dried and subjected to IR spectrometry, in which the intensity for carbonyl absorption was measured. From the spectrometric data and the data in titration, obtained was the degree of modification of the polymer. The polymer was found to have a degree of modification of 1.45% by weight.

Example 1

91.3% by weight of SPS as the component (A), and 8.7% by weight of SEBS1 as the component (B) were mixed. The resulting mixture was further mixed with 43.5 parts by weight, relative to 100 parts by weight of the mixture, (A) and (B), of glass fibers as the component (C), and 43.5 parts by weight, relative to the same, of mica (M-200) as the component (D). Regarding the other additives, Irganox 1010 (antioxidant, 0.2 parts by weight), NA-11 (nucleating agent, 0.4 parts by weight), SH550 (mold release agent, 0.4 parts by weight), and SAYTEX 8010, PATOX-M, DHT4A and F201L (flame retardants and flame retardant promoters, 23.9 parts by weight, 4.3 parts by weight, 0.9 parts by weight and 0.2 parts by weight, respectively) were added thereto, all relative to 100 parts by weight of the mixture, (A) and (B). This was melted and kneaded in a double-screw extruder, and then pelletized.

The resulting pellets were subjected to injection molding to prepare test pieces, for which the resin temperature fell between 280 and 290° C. and the mold temperature was 150° C. These were tested for their properties, and the data obtained are shown in Table 3.

Examples 2 to 25

Other samples were prepared in the same manner as in Example 1, for which, however, used were the components (A), (B), (C), (D), (E), (F) and (G) as shown in Table 1 along with their amounts, and the additives also shown in Table 1 along with their amounts relative to 100 parts by weight of the resin moiety in each sample. In Table 1, the proportions of the components (A), (B), (E), (F) and (G) are in terms of % by weight relative to 100% by weight of the sum total of those components (A), (B), (E), (F) and (G). The proportions of the components (C) and (D) are in terms of parts by weight relative to 100 parts by weight of the sum total of the components (A), (B), (E), (F) and (G). These samples were tested, and the test data are shown in Table 3.

The resin composition of Example 19 was molded into trays for carrying semiconductors, through injection molding, for which the resin temperature was 290° C. and the mold temperature was 150° C. The trays had a surface resistance of $1.01 \times 10^4 \Omega$.

Example 26

The same process as in Example 19 was repeated, except that ketjen black was added in an amount of 7.5 parts by weight herein. The trays produced herein had a surface resistance of $2.10 \times 10^{11} \Omega$.

Comparative Examples 1 to 25

(Except Comparative Examples 17 and 18)

The same process as in Example 1 was repeated, except that the fibrous filler (C) and/or the tabular filler (D) were/was not used but the other filler shown in Table 2 was used herein. The components (A), (B), (E), (F) and (G) and their amounts used are shown in Table 2. The proportions of the additives used herein are also shown in Table 2, which are in terms of parts by weight relative to 100 parts by weight of the sum total of the resin moiety. In Table 2, the proportions of the components (A), (B), (E), (F) and (G) are in terms of % by weight relative to 100% by weight of the sum total of those components (A), (B), (E), (F) and (G). The proportion of the component (C) is in terms of parts by weight relative to 100 parts by weight of the sum total of the components (A), (B), (E), (F) and (G). The test data obtained are shown in Table 4.

Comparative Examples 17 and 18

The same process as in Example 1 was repeated, except that the fibrous filler (C) was not used herein. The components (A), (B), (E), (F) and (G) and their amounts used herein are shown in Table 1. The proportions of the additives used are also shown in Table 1, which are in terms of parts by weight relative to 100 parts by weight of the sum total of the resin moiety. In Table 1, the proportions of the components (A), (B), (E), (F) and (G) are in terms of % by weight relative to 100% by weight of the sum total of those components (A), (B), (E), (F) and (G). The proportion of the component (C) is in terms of parts by weight relative to 100 parts by weight of the sum total of the components (A), (B), (E), (F) and (G). The test data obtained are shown in Table 3.

According to the invention, obtained are moldings of a syndiotactic polystyrenic resin composition, which have good impact resistance and warp little, still having good heat resistance and other good properties intrinsic to styrenic resins. The styrenic resin composition of the invention can be molded into various moldings through injection molding, and is especially favorable to the production of semiconductor carrier devices such as IC trays, etc.

TABLE 1

| | Resin Moiety | | | | | Inorganic Filler Moiety | | | |
|---|---|---|---|---|---|---|---|---|---|
| | (A) | (B) Rubber-like | (E) Compatibi- | (F) Thermo-plastic | (G) | | | | |
| | SPS | Elastomer | lizer | Resin | Polyolefin | (C) Fibrous Filler | | (D) Tabular Filler | |
| | wt. % | wt. % | wt. % | wt. % | wt. % | Type | wt. pts. | Type | wt. pts. |
| Example 1 | 91.3 | 8.7 | 0 | 0 | 0 | glass fibers | 43.5 | mica | 43.5 |
| Example 2 | 91.3 | 8.7 | 0 | 0 | 0 | glass fibers | 43.5 | glass flakes | 43.5 |
| Example 3 | 87 | 8.7 | 4.3 | 0 | 0 | glass fibers | 43.5 | mica | 43.5 |
| Example 4 | 87 | 8.7 | 4.3 | 0 | 0 | glass fibers | 43.5 | glass flakes | 43.5 |
| Example 5 | 73.9 | 8.7 | 0 | 17.4 | 0 | glass fibers | 43.5 | mica | 43.5 |
| Example 6 | 45.7 | 8.7 | 0 | 45.7 | 0 | glass fivers | 43.5 | mica | 43.5 |
| Example 7 | 70 | 8.7 | 4.3 | 17.4 | 0 | glass fibers | 43.5 | mica | 43.5 |
| Example 8 | 43.5 | 8.7 | 4.3 | 43.5 | 0 | glass fibers | 43.5 | mica | 43.5 |

TABLE 1-continued

| | | | | | | | | | |
|---|---|---|---|---|---|---|---|---|---|
| Example 9 | 89.3 | 7.1 | 3.6 | 0 | 0 | glass fibers | 26.8 | mica | 26.8 |
| Example 10 | 89.3 | 7.1 | 3.6 | 0 | 0 | glass fibers | 26.8 | glass flakes | 26.8 |
| Example 11 | 83.3 | 11.1 | 5.6 | 0 | 0 | glass fibers<br>CaCO₃ whiskers | 41.7<br>27.8 | mica | 69.4 |
| Example 12 | 80.7 | 12.9 | 6.4 | 0 | 0 | glass fibers<br>CaCO₃ whiskers | 48.4<br>32.2 | mica | 96.8 |
| Example 13 | 80.7 | 12.9 | 6.4 | 0 | 0 | glass fibers<br>CaCO₃ whiskers | 48.4<br>32.2 | mica | 80.7 |
| Example 14 | 76.9 | 15.4 | 7.7 | 0 | 0 | glass fibers<br>CaCO₃ whiskers | 57.7<br>57.7 | mica | 115.4 |
| Example 15 | 86.7 | 8.9 | 4.4 | 0 | 0 | glass fibers | 22.2 | mica | 88.9 |
| Example 16 | 85 | 10 | 5 | 0 | 0 | glass fibers | 25 | mica | 112.5 |
| Example 17 | 88 | 8 | 4 | 0 | 0 | glass fibers | 30 | mica | 60 |
| Example 18 | 86.7 | 8.9 | 4.4 | 0 | 0 | glass fibers | 33.3 | mica | 77.8 |
| Example 19 | 85 | 10 | 5 | 0 | 0 | glass fibers | 37.5 | mica | 100 |
| Example 20 | 82.9 | 11.4 | 5.7 | 0 | 0 | glass fibers | 42.9 | mica | 128.6 |
| Example 21 | 91.3 | 0 | 0 | 0 | 8.7 | glass fibers | 43.5 | mica | 43.5 |
| Example 22 | 73.9 | 8.7 | 0 | 17.4 | 0 | glass fibers | 43.5 | talc | 43.5 |
| Example 23 | 45.7 | 8.7 | 0 | 45.7 | 0 | glass fibers | 43.5 | talc | 43.5 |
| Example 24 | 69.6 | 8.7 | 4.3 | 17.4 | 0 | glass fibers | 43.5 | talc | 43.5 |
| Example 25 | 43.5 | 8.7 | 4.3 | 43.5 | 0 | glass fibers | 43.5 | talc | 43.5 |
| Comp. Example 17 | 87 | 8.7 | 4.3 | 0 | 0 | — | — | mica | 87 |
| Comp. Example 18 | 87 | 8.7 | 4.3 | 0 | 0 | — | — | glass flakes | 87 |

| | Additives | | | | | | | |
|---|---|---|---|---|---|---|---|---|
| | Antioxidant | | Nucleating Agent | Conductivity Imparting Agent | Mold Release Agent | Flame Retardant | | | |
| | Irg1010 wt. pts. | PEP36 wt. pts. | NA11 wt. pts. | Ketjen Black wt. pts. | SH550 wt. pts. | SAYTEX8010 wt. pts. | PATOX-M wt. pts. | DHT4A wt. pts. | F201L wt. pts. |
| Example 1 | 0.2 | 0 | 0.4 | 0 | 0.4 | 23.9 | 4.3 | 0.9 | 0.2 |
| Example 2 | 0.2 | 0 | 0.4 | 0 | 0.4 | 23.9 | 4.3 | 0.9 | 0.2 |
| Example 3 | 0.2 | 0 | 0.4 | 0 | 0.4 | 23.9 | 4.3 | 0.9 | 0.2 |
| Example 4 | 0.2 | 0 | 0.4 | 0 | 0.4 | 23.9 | 4.3 | 0.9 | 0.2 |
| Example 5 | 0.2 | 0 | 0.4 | 0 | 0.4 | 23.9 | 4.3 | 0.9 | 0.2 |
| Example 6 | 0.2 | 0 | 0.4 | 0 | 0.4 | 23.9 | 4.3 | 0.9 | 0.2 |
| Example 7 | 0.2 | 0 | 0.4 | 0 | 0.4 | 23.9 | 4.3 | 0.9 | 0.2 |
| Example 8 | 0.2 | 0 | 0.4 | 0 | 0.4 | 23.9 | 4.3 | 0.9 | 0.2 |
| Example 9 | 0.2 | 0 | 0.4 | 0 | 0.4 | 20 | 3.6 | 0.7 | 0.2 |
| Example 10 | 0.2 | 0 | 0.4 | 0 | 0.4 | 20 | 3.6 | 0.7 | 0.2 |
| Example 11 | 0.3 | 0 | 0.6 | 0 | 0.6 | 30.6 | 5.6 | 1.1 | 0.3 |
| Example 12 | 0.3 | 0 | 0.6 | 0 | 0.6 | 35.5 | 6.5 | 1.3 | 1.3 |
| Example 13 | 0.3 | 0 | 0.6 | 0 | 0.6 | 35.5 | 6.5 | 1.3 | 1.3 |
| Example 14 | 0.4 | 0 | 0.8 | 0 | 0.8 | 42.3 | 7.7 | 1.5 | 0.4 |
| Example 15 | 0.2 | 0.2 | 0.4 | 11.2 | 0.2 | 0 | 0 | 0 | 0 |
| Example 16 | 0.3 | 0.3 | 0.5 | 12.5 | 0.5 | 0 | 0 | 0 | 0 |
| Example 17 | 0.2 | 0.2 | 0.4 | 10 | 0.4 | 0 | 0 | 0 | 0 |
| Example 18 | 0.2 | 0.2 | 0.4 | 11.2 | 0.2 | 0 | 0 | 0 | 0 |
| Example 19 | 0.3 | 0.3 | 0.5 | 12.5 | 0.5 | 0 | 0 | 0 | 0 |
| Example 20 | 0.3 | 0.3 | 0.6 | 14.3 | 0.6 | 0 | 0 | 0 | 0 |
| Example 21 | 0.2 | 0 | 0.4 | 0 | 0.4 | 23.9 | 4.4 | 0.9 | 0.2 |
| Example 22 | 0.2 | 0 | 0.4 | 0 | 0.4 | 23.9 | 4.3 | 0.9 | 0.2 |
| Example 23 | 0.2 | 0 | 0.4 | 0 | 0.4 | 23.9 | 4.3 | 0.9 | 0.2 |
| Example 24 | 0.2 | 0 | 0.4 | 0 | 0.4 | 23.9 | 4.3 | 0.9 | 0.2 |
| Example 25 | 0.2 | 0 | 0.4 | 0 | 0.4 | 23.9 | 4.3 | 0.9 | 0.2 |
| Comp. Example 17 | 0.2 | 0 | 0.4 | 0 | 0.4 | 23.9 | 4.3 | 0.9 | 0.2 |
| Comp. Example 18 | 0.2 | 0 | 0.4 | 0 | 0.4 | 23.9 | 4.3 | 0.9 | 0.2 |

TABLE 2

| | Resin Moiety | | | | | Inorganic Filler Moiety | | | |
|---|---|---|---|---|---|---|---|---|---|
| | (A) | (B) Rubber-like | (E) Compatibi- | (F) Thermo-plastic | (G) | (C) Fibrous Filler | | (D) Tabular Filler | |
| | SPS | Elastomer | lizer | Resin | Polyolefin | | | | |
| | wt. % | wt. % | wt. % | wt. % | wt. % | Type | wt. pts. | Type | wt. pts. |
| Comp. Ex. 1 | 91.3 | 8.7 | 0 | 0 | 0 | glass fibers | 43.5 | glass beads | 43 |
| Comp. Ex. 2 | 91.3 | 8.7 | 0 | 0 | 0 | glass fibers | 43.5 | CaCO$_3$ | 43 |
| Comp. Ex. 3 | 87 | 8.7 | 4.3 | 0 | 0 | glass fibers | 43.5 | glass beads | 43 |
| Comp. Ex. 4 | 87 | 8.7 | 4.3 | 0 | 0 | glass fibers | 43.5 | CaCO$_3$ | 43 |
| Comp. Ex. 5 | 73.9 | 8.7 | 0 | 17.4 | 0 | glass fibers | 43.5 | glass beads | 43 |
| Comp. Ex. 6 | 45.7 | 8.7 | 0 | 45.7 | 0 | glass fibers | 43.5 | glass beads | 43 |
| Comp. Ex. 7 | 70 | 8.7 | 4.3 | 17.4 | 0 | glass fibers | 43.5 | glass beads | 43 |
| Comp. Ex. 8 | 43.5 | 8.7 | 4.3 | 43.5 | 0 | glass fibers | 43.5 | glass beads | 43 |
| Comp. Ex. 9 | 89.3 | 7.1 | 3.6 | 0 | 0 | glass fibers | 26.8 | glass beads | 26.8 |
| Comp. Ex. 10 | 89.3 | 7.1 | 3.6 | 0 | 0 | glass fibers | 26.8 | CaCO$_3$ | 26.8 |
| Comp. Ex. 11 | 83.3 | 11.1 | 5.6 | 0 | 0 | glass fibers<br>CaCO$_3$ whiskers | 41.7<br>27.8 | CaCO$_3$ | 69.4 |
| Comp. Ex. 12 | 80.7 | 12.9 | 6.4 | 0 | 0 | glass fibers<br>CaCO$_3$ whiskers | 48.4<br>32.2 | CaCO$_3$ | 96.8 |
| Comp. Ex. 13 | 80.7 | 12.9 | 6.4 | 0 | 0 | glass fibers<br>CaCO$_3$ whiskers | 48.4<br>32.2 | CaCO$_3$ | 80.7 |
| Comp. Ex. 14 | 76.9 | 15.4 | 7.7 | 0 | 0 | glass fibers<br>CaCO$_3$ whiskers | 57.7<br>57.7 | CaCO$_3$ | 115.4 |
| Comp. Ex. 15 | 87 | 8.7 | 4.3 | 0 | 0 | glass fibers | 87 | — | — |
| Comp. Ex. 16 | 87 | 8.7 | 4.3 | 0 | 0 | — | — | glass beads | 87 |
| Comp. Ex. 19 | 86.7 | 8.9 | 4.4 | 0 | 0 | glass fibers | 22.2 | CaCO$_3$ | 33.3 |
| Comp. Ex. 20 | 85 | 10 | 5 | 0 | 0 | glass fibers | 25 | CaCO$_3$ | 112.5 |
| Comp. Ex. 21 | 88 | 8 | 4 | 0 | 0 | glass fibers | 30 | CaCO$_3$ | 60 |
| Comp. Ex. 22 | 86.7 | 8.9 | 4.4 | 0 | 0 | glass fibers | 33.3 | CaCO$_3$ | 77.8 |
| Comp. Ex. 23 | 85 | 10 | 5 | 0 | 0 | glass fibers | 37.5 | CaCO$_3$ | 100 |
| Comp. Ex. 24 | 82.9 | 11.4 | 5.7 | 0 | 0 | glass fibers | 42.9 | CaCO$_3$ | 128.6 |
| Comp. Ex. 25 | 86.7 | 8.9 | 4.4 | 0 | 0 | glass fibers | 55.5 | CaCO$_3$ | 55.5 |

| | Additives | | | | | | | |
|---|---|---|---|---|---|---|---|---|
| | Antioxidant | | Nucleating Agent | Conductivity Imparting Agent | Mold Release Agent | Flame Retardant | | | |
| | Irg1010 wt. pts. | PEP36 wt. pts. | NA11 wt. pts. | Ketjen Black wt. pts. | SH550 wt. pts. | SAYTEX8010 wt. pts. | PATOX-M wt. pts. | DHT4A wt. pts. | F201L wt. pts. |
| Comp. Ex. 1 | 0.2 | 0 | 0.4 | 0 | 0.4 | 23.9 | 4.3 | 0.9 | 0.2 |
| Comp. Ex. 2 | 0.2 | 0 | 0.4 | 0 | 0.4 | 23.9 | 4.3 | 0.9 | 0.2 |
| Comp. Ex. 3 | 0.2 | 0 | 0.4 | 0 | 0.4 | 23.9 | 4.3 | 0.9 | 0.2 |
| Comp. Ex. 4 | 0.2 | 0 | 0.4 | 0 | 0.4 | 23.9 | 4.3 | 0.9 | 0.2 |
| Comp. Ex. 5 | 0.2 | 0 | 0.4 | 0 | 0.4 | 23.9 | 4.3 | 0.9 | 0.2 |
| Comp. Ex. 6 | 0.2 | 0 | 0.4 | 0 | 0.4 | 23.9 | 4.3 | 0.9 | 0.2 |
| Comp. Ex. 7 | 0.2 | 0 | 0.4 | 0 | 0.4 | 23.9 | 4.3 | 0.9 | 0.2 |
| Comp. Ex. 8 | 0.2 | 0 | 0.4 | 0 | 0.4 | 23.9 | 4.3 | 0.9 | 0.2 |
| Comp. Ex. 9 | 0.2 | 0 | 0.4 | 0 | 0.4 | 20 | 3.6 | 0.7 | 0.2 |
| Comp. Ex. 10 | 0.2 | 0 | 0.4 | 0 | 0.4 | 20 | 3.6 | 0.7 | 0.2 |
| Comp. Ex. 11 | 0.3 | 0 | 0.6 | 0 | 0.6 | 30.6 | 5.6 | 1.1 | 0.3 |
| Comp. Ex. 12 | 0.3 | 0 | 0.6 | 0 | 0.6 | 35.5 | 6.5 | 1.3 | 1.3 |
| Comp. Ex. 13 | 0.3 | 0 | 0.6 | 0 | 0.6 | 35.5 | 6.5 | 1.3 | 1.3 |
| Comp. Ex. 14 | 0.4 | 0 | 0.8 | 0 | 0.8 | 42.3 | 7.7 | 1.5 | 0.4 |
| Comp. Ex. 15 | 0.2 | 0 | 0.4 | 0 | 0.4 | 23.9 | 4.3 | 0.9 | 0.2 |
| Comp. Ex. 16 | 0.2 | 0 | 0.4 | 0 | 0.4 | 23.9 | 4.3 | 0.9 | 0.2 |
| Comp. Ex. 19 | 0.2 | 0.2 | 0.4 | 11.2 | 0.2 | 0 | 0 | 0 | 0 |
| Comp. Ex. 20 | 0.3 | 0.3 | 0.5 | 12.5 | 0.5 | 0 | 0 | 0 | 0 |
| Comp. Ex. 21 | 0.2 | 0.2 | 0.4 | 10 | 0.4 | 0 | 0 | 0 | 0 |
| Comp. Ex. 22 | 0.2 | 0.2 | 0.4 | 11.2 | 0.2 | 0 | 0 | 0 | 0 |
| Comp. Ex. 23 | 0.3 | 0.3 | 0.5 | 12.5 | 0.5 | 0 | 0 | 0 | 0 |
| Comp. Ex. 24 | 0.3 | 0.3 | 0.6 | 14.3 | 0.6 | 0 | 0 | 0 | 0 |
| Comp. Ex. 25 | 0.2 | 0.2 | 0.4 | 11.2 | 0.2 | 0 | 0 | 0 | 0 |

TABLE 3

| | Test Data | | | |
|---|---|---|---|---|
| | Flexural Strength (MPa) | Izod Impact Strength (KJ/m$^2$) | Deflection Temperature under load (° C.) | Degree of Warpage B |
| Example 1 | 127 | 6 | 235 | B |
| Example 2 | 145 | 7 | 239 | B |
| Example 3 | 132 | 6.6 | 237 | B |
| Example 4 | 150 | 7.4 | 241 | B |
| Example 5 | 128 | 7.8 | 225 | B |
| Example 6 | 126 | 8.4 | 200 | B |
| Example 7 | 130 | 8 | 227 | B |
| Example 8 | 128 | 8.6 | 203 | B |
| Example 9 | 119 | 6.1 | 235 | B |
| Example 10 | 133 | 6.6 | 236 | B |
| Example 11 | 118 | 4 | 230 | A |
| Example 12 | 110 | 4 | 228 | A |
| Example 13 | 125 | 4.2 | 237 | A |
| Example 14 | 120 | 4 | 235 | A |
| Example 15 | 74 | 3.4 | 207 | A |
| Example 16 | 71 | 3 | 204 | A |
| Example 17 | 85 | 4 | 218 | A |
| Example 18 | 73 | 3 | 215 | A |
| Example 19 | 61 | 3 | 204 | A |
| Example 20 | 62 | 3 | 203 | A |
| Example 21 | 120 | 5 | 233 | B |
| Example 22 | 125 | 7.6 | 223 | B |
| Example 23 | 123 | 8 | 200 | B |
| Example 24 | 126 | 7.8 | 225 | B |
| Example 25 | 124 | 8.4 | 200 | B |
| Comp. Ex. 17 | 66 | 1.2 | 144 | A |
| Comp. Ex. 18 | 77 | 1.2 | 119 | A |

TABLE 4

| | Test Data | | | |
|---|---|---|---|---|
| | Flexural Strength (MPa) | Izod Impact Strength (KJ/m$^2$) | Deflection Temperature under load (° C.) | Degree of Warpage D |
| Comp.Ex. 1 | 145 | 7.4 | 240 | D |
| Comp.Ex. 2 | 143 | 7.4 | 238 | D |
| Comp.Ex. 3 | 149 | 7.8 | 243 | D |
| Comp.Ex. 4 | 146 | 7.6 | 240 | D |
| Comp.Ex. 5 | 145 | 8 | 222 | D |
| Comp.Ex. 6 | 140 | 8.5 | 195 | D |
| Comp.Ex. 7 | 147 | 8.2 | 225 | D |
| Comp.Ex. 8 | 145 | 8.8 | 200 | D |
| Comp.Ex. 9 | 130 | 6.7 | 236 | D |
| Comp.Ex. 10 | 127 | 6.6 | 234 | D |
| Comp.Ex. 11 | 130 | 5.2 | 230 | D |
| Comp.Ex. 12 | 124 | 5 | 228 | D |
| Comp.Ex. 13 | 141 | 5.6 | 240 | D |
| Comp.Ex. 14 | 136 | 5.4 | 238 | D |
| Comp.Ex. 15 | 184 | 9.1 | 249 | D |
| Comp.Ex. 16 | 71 | 1.5 | 102 | A |
| Comp.Ex. 19 | 90 | 3.8 | 210 | D |
| Comp.Ex. 20 | 86 | 3.1 | 205 | D |
| Comp.Ex. 21 | 101 | 4.4 | 221 | D |
| Comp.Ex. 22 | 89 | 3.8 | 218 | D |
| Comp.Ex. 23 | 77 | 3.4 | 207 | D |
| Comp.Ex. 24 | 75 | 3 | 203 | D |
| Comp.Ex. 25 | 75 | 3 | 203 | D |

What is claimed is:

1. A styrenic resin composition comprises,
   a) 100 parts by weight of a styrenic resin composition containing a styrenic polymer that consists chiefly of a syndiotactic structure;
   b) from 10 to 350 parts by weight, relative to 100 parts by weight of the composition, of (C) a fibrous filler and;
   c) from 10 to 350 parts by weight, relative to the same, of (D) a tabular filler having a mean grain size of from 4 to 700 μm and a mean aspect ratio of from 12 to 120.

2. A styrenic resin composition comprises,
   a) 100 parts by weight of a styrenic resin composition containing from 50 to 99% by weight of (A) a styrenic polymer that consists chiefly of a syndiotactic structure and from 1 to 50% by weight of (B) a rubber-like elastomer having affinity for the component (A);
   b) from 10 to 350 parts by weight, relative to 100 parts by weight of the composition, of (C) a fibrous filler and;
   c) from 10 to 350 parts by weight, relative to the same, of (D) a tabular filler having a mean grain size of from 4 to 700 μm and a mean aspect ratio of from 12 to 120.

3. A styrenic resin composition comprises,
   a) 100 parts by weight of a styrenic resin composition containing from 50 to 95% by weight of (A) a styrenic polymer that consists chiefly of a syndiotactic structure, from 1 to 49.9% by weight of (B) a rubber-like elastomer having affinity for the component (A), and from 0.1 to 10% by weight of (E) a polymer having compatibility with or affinity for the component (A) and having a polar group;
   b) from 10 to 350 parts by weight, relative to 100 parts by weight of the composition, of (C) a fibrous filler; and
   c) from 10 to 350 parts by weight, relative to the same, of (D) a tabular filler having a mean grain size of from 4 to 700 μm and a mean aspect ratio of from 12 to 120.

4. A styrenic resin composition comprises,
   a) 100 parts by weight of a styrenic resin composition containing from 5 to 94% by weight of (A) a styrenic polymer that consists chiefly of a syndiotactic structure, from 1 to 50% by weight of (B) a rubber-like elastomer having affinity for the component (A), and from 5 to 94% by weight of (F) a thermoplastic resin except (A);
   b) from 10 to 350 parts by weight, relative to 100 parts by weight of the composition, of (C) a fibrous filler; and
   c) from 10 to 350 parts by weight, relative to the same, of (D) a tabular filler having a mean grain size of from 4 to 700 μm and a mean aspect ratio of from 12 to 120.

5. A styrenic resin composition comprises,
   a) 100 parts by weight of a styrenic resin composition containing from 5 to 93.9% by weight of (A) a styrenic polymer that consists chiefly of a syndiotactic structure, from 1 to 50% by weight of (B) a rubber-like elastomer having affinity for the component (A), from 0.1 to 10% by weight of (E) a polymer having compatibility with or affinity for the component (A) and having a polar group, and from 5 to 93.9% by weight of (F) a thermoplastic resin except (A);
   b) from 10 to 350 parts by weight, relative to 100 parts by weight of the composition, of (C) a fibrous filler; and
   c) from 10 to 350 parts by weight, relative to the same, of (D) a tabular filler having a mean grain size of from 4 to 700 μm and a mean aspect ratio of from 12 to 120.

6. A styrenic resin composition comprises,
   a) 100 parts by weight of a styrenic resin composition containing from 50 to 99% by weight of (A) a styrenic polymer that consists chiefly of a syndiotactic structure and from 1 to 50% by weight of (G) a polyolefin having a melt index (MI), as measured at 190° C. and under a load of 2.16 kg, of at most 25 (g/10 min);
   b) from 10 to 350 parts by weight, relative to 100 parts by weight of the composition, of (C) a fibrous filler; and
   c) from 10 to 350 parts by weight, relative to the same, of (D) a tabular filler having a mean grain size of from 4 to 700 μm and a mean aspect ratio of from 12 to 120.

7. The styrenic resin composition as claimed in claim 1, wherein the fibrous filler (C) is glass fibers, and the tabular filler (D) having a mean grain size of from 4 to 700 µm and a mean aspect ratio of from 12 to 120 is any of mica or glass flakes.

8. Semiconductor carrier device as produced by molding the styrenic resin composition of claim 1 and having a surface resistance of from $10^2$ to $10^{12} \Omega$.

9. The styrenic resin composition as claimed in claim 2, wherein the fibrous filler (C) is glass fibers, and the tabular filler (D) having a mean grain size of from 4 to 700 µm and a mean aspect ratio of from 12 to 120 is any of mica or glass flakes.

10. The styrenic resin composition as claimed in claim 3, wherein the fibrous filler (C) is glass fibers, and the tabular filler (D) having a mean grain size of from 4 to 700 µm and a mean aspect ratio of from 12 to 120 is any of mica or glass flakes.

11. The styrenic resin composition as claimed in claim 4, wherein the fibrous filler (C) is glass fibers, and the tabular filler (D) having a mean grain size of from 4 to 700 µm and a mean aspect ratio of from 12 to 120 is any of mica or glass flakes.

12. The styrenic resin composition as claimed in claim 5, wherein the fibrous filler (C) is glass fibers, and the tabular filler (D) having a mean grain size of from 4 to 700 µm and a mean aspect ratio of from 12 to 120 is any of mica or glass flakes.

13. The styrenic resin composition as claimed in claim 6, wherein the fibrous filler (C) is glass fibers, and the tabular filler (D) having a mean grain size of from 4 to 700 µm and a mean aspect ratio of from 12 to 120 is any of mica or glass flakes.

14. Semiconductor carrier device as produced by molding the styrenic resin composition of claim 1 and having a surface resistance of from $10^2$ to $10^{12} \Omega$.

15. Semiconductor carrier device as produced by molding the styrenic resin composition of claim 2 and having a surface resistance of from $10^2$ to $10^{12} \Omega$.

16. Semiconductor carrier device as produced by molding the styrenic resin composition of claim 3 and having a surface resistance of from $10^2$ to $10^{12} \Omega$.

17. Semiconductor carrier device as produced by molding the styrenic resin composition of claim 4 and having a surface resistance of from $10^2$ to $10^{12} \Omega$.

18. Semiconductor carrier device as produced by molding the styrenic resin composition of claim 5 and having a surface resistance of from $10^2$ to $10^{12} \Omega$.

19. Semiconductor carrier device as produced by molding the styrenic resin composition of claim 6 and having a surface resistance of from $10^2$ to $10^{12} \Omega$.

20. Semiconductor carrier device as produced by molding the styrenic resin composition of claim 7 and having a surface resistance of from $10^2$ to $10^{12} \Omega$.

* * * * *